United States Patent
Kusunoki et al.

(10) Patent No.: US 9,512,540 B2
(45) Date of Patent: Dec. 6, 2016

(54) METHOD FOR MANUFACTURING N-TYPE SIC SINGLE CRYSTAL BY SOLUTION GROWTH USING A MIXED GAS ATMOSPHERE

(75) Inventors: Kazuhiko Kusunoki, Tokyo (JP); Kazuhito Kamei, Tokyo (JP); Nobuyoshi Yashiro, Tokyo (JP); Kouji Moriguchi, Tokyo (JP); Nobuhiro Okada, Tokyo (JP); Katsunori Danno, Susono (JP); Hironori Daikoku, Susono (JP)

(73) Assignees: NIPPON STEEL & SUMITOMO METAL CORPORATION, Tokyo (JP); TOYOTA JIDOSHA KABUSHIKI KAISHA, Aichi-ken (JP)

( * ) Notice: Subject to any disclaimer, the term of this patent is extended or adjusted under 35 U.S.C. 154(b) by 302 days.

(21) Appl. No.: 13/883,350
(22) PCT Filed: Nov. 4, 2011
(86) PCT No.: PCT/JP2011/075483
§ 371 (c)(1),
(2), (4) Date: May 3, 2013
(87) PCT Pub. No.: WO2012/063743
PCT Pub. Date: May 18, 2012

(65) Prior Publication Data
US 2013/0220212 A1    Aug. 29, 2013

(30) Foreign Application Priority Data
Nov. 9, 2010    (JP) .................. 2010-250492

(51) Int. Cl.
*C30B 15/20* (2006.01)
*C30B 17/00* (2006.01)
(Continued)

(52) U.S. Cl.
CPC .............. *C30B 15/20* (2013.01); *C30B 15/10* (2013.01); *C30B 15/30* (2013.01); *C30B 15/36* (2013.01);
(Continued)

(58) Field of Classification Search
CPC ............... C30B 9/00; C30B 9/04; C30B 9/08; C30B 9/10; C30B 15/00; C30B 15/02; C30B 15/04; C30B 15/20; C30B 19/00; C30B 19/02; C30B 19/10
(Continued)

(56) References Cited

U.S. PATENT DOCUMENTS 5,187,547 A    2/1993 Niina et al.
5,322,824 A    6/1994 Chia
(Continued)

FOREIGN PATENT DOCUMENTS

CN    1046567    10/1990
CN    1191580    8/1998
(Continued)

OTHER PUBLICATIONS

M. Ikeda et al., "Fabrication of 6H-SiC Light-Emitting Diodes by a Rotation Dipping Technique: Electroluminescence Mechanism", J. Appl. Phys. vol. 50, No. 12, pp. 8215-8225, Dec. 1979.
(Continued)

*Primary Examiner* — Kenneth A Bratland, Jr.
(74) *Attorney, Agent, or Firm* — Clark & Brody (57) ABSTRACT

A method for manufacturing an n-type SiC single crystal, enables the suppression of the variation in nitrogen concentration among a plurality of n-type SiC single crystal ingots manufactured. A method includes the steps of: providing a manufacturing apparatus (100) including a chamber (1) having an area in which a crucible (7) is to be disposed; heating the area in which the crucible (7) is to be disposed and evacuating the gas in the chamber (1); filling, after the evacuation, the chamber (1) with a mixed gas containing a noble gas and nitrogen gas; heating and melting a starting material housed in the crucible (7) disposed in the area to produce a SiC solution (8) containing silicon and carbon; and immersing a SiC seed crystal into the SiC solution under the mixed gas atmosphere to grow an n-type SiC single crystal on the SiC seed crystal.

6 Claims, 5 Drawing Sheets

(51) Int. Cl.
 *C30B 19/02* (2006.01)
 *C30B 29/36* (2006.01)
 *C30B 15/10* (2006.01)
 *C30B 15/30* (2006.01)
 *C30B 15/36* (2006.01)

(52) U.S. Cl.
 CPC ............... *C30B 17/00* (2013.01); *C30B 19/02* (2013.01); *C30B 29/36* (2013.01)

(58) Field of Classification Search
 USPC ... 117/11, 13, 19, 21–22, 35, 54, 58, 64, 73, 117/78–79, 200, 206, 208, 218, 937, 951
 See application file for complete search history.

(56) References Cited

U.S. PATENT DOCUMENTS

| | | | |
|---|---|---|---|
| 5,433,167 A | 7/1995 | Furukawa et al. | |
| 5,718,760 A | 2/1998 | Carter et al. | |
| 8,492,774 B2* | 7/2013 | Kusunoki | C30B 19/02 257/77 |
| 2005/0092232 A1* | 5/2005 | Hawtof | C30B 11/00 117/81 |
| 2010/0308344 A1* | 12/2010 | Seki | C30B 15/00 257/77 |
| 2011/0198614 A1* | 8/2011 | Kusunoki | C30B 19/02 257/77 |
| 2011/0200833 A1* | 8/2011 | Kamei | C30B 9/10 428/446 |

FOREIGN PATENT DOCUMENTS

| | | | |
|---|---|---|---|
| DE | 112009000196 | 1/2011 | |
| EP | 1403404 | 3/2004 | |
| EP | 1498518 | 1/2005 | |
| JP | 60-260498 | 12/1985 | |
| JP | 05-221796 | 8/1993 | |
| JP | 05-262599 | 10/1993 | |
| JP | 06-219898 | 8/1994 | |
| JP | 2000-264790 | 9/2000 | |
| JP | 2003-073194 | 3/2003 | |
| JP | 2003-277193 | 10/2003 | |
| JP | 2004-002173 | 1/2004 | |
| JP | 2005-082435 | 3/2005 | |
| JP | 2006-245128 | 9/2006 | |
| JP | 2007-076986 | 3/2007 | |
| JP | 2007-153719 | 6/2007 | |
| JP | WO 2009095764 A1 * | 8/2009 | ............. C30B 15/00 |
| JP | WO 2010024390 A1 * | 3/2010 | ............. C30B 19/02 |
| JP | WO 2010024392 A1 * | 3/2010 | ............... C30B 9/10 |
| WO | 2007/116315 | 10/2007 | |
| WO | 2009/000140 | 12/2008 | |
| WO | WO 2009095764 A1 * | 8/2009 | |
| WO | 2010/024390 | 3/2010 | |
| WO | WO 2010024390 A1 * | 3/2010 | |

OTHER PUBLICATIONS

W. Munch et al., "Silicon Carbide Blue-Emitting Diodes Produced by Liquid-Phase Epitaxy", Solid-State Electronics, vol. 21, pp. 1129-1132, 1978.

M. Cooke, "Semiconductor Hardnut", III-Vs Review the Advanced Semiconductor Magazine, vol. 18, No. 9, pp. 40-44, Dec. 2005-Jan. 2006.

First Office Action of U.S. Appl. No. 12/864,687, mailing date Jun. 28, 2012.

Final Office Action of U.S. Appl. No. 12/864,687, mailing date Nov. 26, 2012.

* cited by examiner

METHOD FOR MANUFACTURING N-TYPE SIC SINGLE CRYSTAL BY SOLUTION GROWTH USING A MIXED GAS ATMOSPHERE

TECHNICAL FIELD

The present invention relates to a method for manufacturing a silicon carbide (SiC) single crystal, and more particularly to a method for manufacturing an n-type SiC single crystal.

BACKGROUND ART

Silicon carbide (SiC) is a thermally and chemically stable compound semiconductor. Compared with silicon (Si), SiC has an excellent bandgap, breakdown voltage, electron saturation velocity, and thermal conductivity. Therefore, SiC has gained attention as the next generation power device material.

SiC is well known as a substance having a crystal polymorphism. A typical crystal polymorphism of SiC includes a 6H type (hexagonal system having 6 molecules per cycle), a 4H type (hexagonal system having 4 molecules per cycle), and a 3C type (cubic system having 3 molecules per cycle). SiC to be used for power device material is preferably a single crystal made up of one crystal polymorphism, and the SiC single crystal preferably has less crystal defects.

In particular, for vertical type power devices such as an SBD (Shottky Barrier Diode) and a MOSFET (Metal-Oxide-Semiconductor Field Effect Transistor), an n-type SiC single crystal having lower electric resistance is preferably applied. Upon manufacturing an n-type SiC single crystal, it is preferable that there is less variation in the dopant concentration among individuals of a plurality of SiC single crystals manufactured. That is, it is preferable that there is not much difference in the dopant concentration among a plurality of SiC single crystal ingots manufactured. In other words, among a plurality of SiC single crystals manufactured, it is preferable that not much difference occurs between the dopant concentration of one SiC single crystal ingot and that of another SiC single crystal ingot.

By the way, the method for manufacturing a SiC single crystal includes a sublimation method and a liquid phase growth method. A method for manufacturing a SiC single crystal by the sublimation method is disclosed, for example, in JP05-262599A (Patent Document 1). Moreover, a method for manufacturing a SiC single crystal by the liquid phase growth method is disclosed in, for example, JP2004-2173A (Patent Document 2).

The liquid phase growth method is more likely to provide a single crystal having less crystal defects compared to the sublimation method. A top seeded solution growth method (hereinafter referred to as a TSSG method), which is one of the liquid phase growth methods, immerses a SiC seed crystal made up of a SiC single crystal into a SiC solution housed in a crucible. Next, the TSSG method grows a SiC single crystal on the SiC seed crystal while pulling up the SiC seed crystal.

The TSSG method grows a SiC single crystal while pulling up a SiC seed crystal. Therefore, it is possible to obtain a long-size SiC single crystal. As described above, since the TSSG method grows the SiC single crystal while pulling up the SiC seed crystal, it resembles to the Czochralski (CZ) process. On that account, the diameter expanding technique of Si single crystal in the CZ process can be transferred to the TSSG. On that account, the TSSG method is suitable for the manufacturing of a large diameter, long-size SiC single crystal ingot having few crystal defects.

DISCLOSURE OF THE INVENTION

However, there has been no report on any case where a method has been disclosed for manufacturing an n-type SiC single crystal in which doping control is performed by the TSSG method. As described above, when manufacturing an n-type SiC single crystal, it is preferable that the dopant concentration of each SiC single crystal ingot manufactured is less likely to vary from each other.

It is an object of the present invention to provide a method for manufacturing an n-type SiC single crystal, the method being able to suppress the variation in the dopant concentration among a plurality of n-type SiC single crystal ingots manufactured.

A method for manufacturing an n-type SiC single crystal according to an embodiment of the present invention includes the steps of: providing a manufacturing apparatus including a chamber having an area in which a crucible is to be disposed; heating the area in which the crucible is to be disposed and evacuating the chamber; filling, after the evacuation, the chamber with a mixed gas containing a noble gas and nitrogen gas; heating and melting a starting material housed in the crucible disposed in the area to produce a SiC solution containing silicon and carbon; and immersing a SiC seed crystal into the SiC solution under the mixed gas atmosphere to grow an n-type SiC single crystal on the SiC seed crystal.

The method for manufacturing an n-type SiC single crystal according to an embodiment of the present invention can reduce the variation in dopant concentration (nitrogen concentration) of a plurality of n-type SiC single crystal ingots manufactured.

DESCRIPTION OF EMBODIMENTS

Hereinafter, referring to the drawings, embodiments of the present invention will be described in detail. Like or corresponding components in the drawings are given like reference symbols and the description thereof will not be repeated.

The present inventors have studied a method for manufacturing an n-type SiC single crystal in a TSSG method. The TSSG method utilizes a manufacturing apparatus. The manufacturing apparatus used in the TSSG method includes a chamber which can be water cooled. The chamber includes a crucible for housing a SiC solution which provides a starting material of a SiC single crystal, a heating unit for heating the crucible, and a heat insulating material disposed in the surroundings of the crucible. The crucible is made of graphite. The manufacturing apparatus further includes an up-and-down movable and rotatable seed shaft which has a SiC seed crystal attached to its lower end.

In the TSSG method, a SiC single crystal is manufactured by the following steps. First, the crucible is disposed in the chamber. A noble gas is filled in the chamber. The crucible is heated by the heating unit. At this moment, a starting material of the SiC solution housed in the crucible melts to become a melt. Further, carbon dissolves into the melt from the crucible and thereby a SiC solution is produced.

A shaft having a SiC seed crystal attached to its lower end is moved down to be immersed into the SiC solution. At this moment, the SiC solution is held at a crystal growth temperature. The shaft is gradually pulled up while the SiC seed crystal and the crucible are rotated. At this time, a portion of the SiC solution into which the SiC seed crystal is immersed is brought into a supercooled state. By the above described steps, a SiC single crystal grows on the surface of the SiC seed crystal.

The present inventors have attempted to manufacture an n-type SiC single crystal ingot by filling the chamber with a mixed gas made up of a noble gas and nitrogen gas in place of the noble gas, and growing a SiC single crystal. As a result, an n-type SiC single crystal was manufactured. However, there was a large variation in the nitrogen concentrations of a plurality of n-type SiC single crystals manufactured.

Accordingly, the present inventors studied causal factors by which the nitrogen concentration of n-type SiC single crystal varies in the above described manufacturing method. As a result, the present inventors have come to think that the nitrogen concentration of n-type SiC single crystal significantly varies among respective n-type SiC crystals due to the following causes.

That is, a nitrogen source exists in the chamber other than nitrogen gas which is intentionally introduced as the mixed gas. To be specific, since nitrogen gas has adsorbed to each member in the chamber in advance, each member acts as the above described nitrogen source. Accordingly, the amount of nitrogen gas desorbed from the nitrogen source in the chamber is large enough not to be negligible with respect to the amount of nitrogen gas intentionally introduced. Further, each time an n-type SiC single crystal is manufactured (that is, between manufacturing batches), the amount of nitrogen gas desorbed from the nitrogen source in the chamber varies. As a result, the nitrogen concentration of n-type SiC single crystals manufactured significantly varies for each manufacturing batch, that is, among respective SiC single crystals. Hereinafter, the nitrogen gas that is desorbed by heating from the nitrogen source in the chamber is referred to as "impurity nitrogen gas".

A method to adjust the nitrogen gas concentration in the mixed gas taking into account the impurity nitrogen gas is also conceivable. However, it is difficult to quantitate the amount of impurity nitrogen gas generated. Accordingly, the present inventors thought that discharging the impurity nitrogen gas out of the chamber in advance before growing an n-type SiC single crystal, and thereafter introducing a mixed gas into the chamber to manufacture an n-type SiC single crystal will decrease the variation in nitrogen concentration among n-type SiC single crystal ingots. To be specific, the present inventors thought that the impurity nitrogen gas released by heating from members disposed near the area in which the crucible is to be disposed may be evacuated by heating at least the area in which the crucible is to be disposed in the chamber before growing the n-type SiC single crystal.

The present inventors have further studied a preferable heating temperature and degree of vacuum when evacuating the impurity nitrogen gas. A preferable nitrogen concentration in an n-type SiC single crystal is $8.0 \times 10^{18}$ to $3.0 \times 10^{19}$ $cm^{-3}$. As a result of the study, it has been found that when manufacturing an n-type SiC having the above described nitrogen concentration, discharging impurity nitrogen gas while keeping the temperature of the area in which the crucible is to be disposed at not less than 1100° C. and the degree of vacuum inside the chamber at not more than $1.0 \times 10^{-1}$ Pa will lead to a marked decrease in the variation in nitrogen concentration of the n-type SiC single crystals manufactured.

A method for manufacturing an n-type SiC single crystal according to the present embodiment is based on the above described finding and an outline thereof is as follows.

A method for manufacturing an n-type SiC single crystal according to the present embodiment includes the steps of: providing a manufacturing apparatus including a chamber having an area in which a crucible is to be disposed; heating the area in which the crucible is to be disposed and evacuating the chamber; filling, after evacuation, the chamber with a mixed gas containing a noble gas and nitrogen gas; heating and melting a starting material housed in the crucible disposed in the area to produce a SiC solution containing silicon and carbon; and immersing a SiC seed crystal into the SiC solution under the mixed gas atmosphere to grow an n-type SiC single crystal on the SiC seed crystal.

In an embodiment of the present invention, the area in which the crucible is to be disposed in the chamber is heated and the chamber is evacuated before an n-type SiC single crystal is grown. On that account, impurity nitrogen gas released by heating from members in the chamber is discharged to the outside of the chamber. Therefore, it is possible to grow an n-type SiC single crystal containing a nitrogen concentration corresponding to the nitrogen concentration in the mixed gas, and thereby the variation in nitrogen concentration in the n-type SiC single crystals manufactured is suppressed.

Preferably, in the step of evacuation, the area in which the crucible is to be disposed is heated to not less than 1100° C., and the chamber is evacuated to a degree of vacuum of not more than $1.0 \times 10^{-1}$ Pa.

In this case, the variation in nitrogen concentration of n-type SiC single crystals manufactured will markedly decrease.

Preferably, in the step of evacuation, the area in which the crucible is to be disposed is heated to not less than a crystal growth temperature of the n-type SiC single crystal.

In this case, the variation in nitrogen concentration of n-type SiC single crystals manufactured will markedly decrease.

Preferably, in the step of evacuation, the chamber is evacuated to a degree of vacuum of not more than $5.0 \times 10^{-2}$ Pa.

In this case, it is possible to further suppress the variation in nitrogen concentration of n-type SiC single crystals manufactured.

Preferably, the manufacturing method further includes the steps of: disposing the crucible at a location apart from the area in the chamber before evacuating the chamber; and disposing the crucible in the area after evacuation.

In this case, in the evacuation step, the starting material in the crucible will not melt. On that account, it is possible to suppress the impurity nitrogen gas generated during the evacuation step from entering into the starting material in the crucible.

Preferably, the crucible includes a cover member having a through hole. The manufacturing apparatus further includes a shaft and a hook member. The shaft is up-and-down movable in the chamber, wherein a SiC seed crystal is to be attached to a lower end of the shaft, and the lower end is disposed in the crucible through the through hole. The hook member is disposed at a shaft portion apart from the lower end of the shaft, and capable of suspending the crucible when coming into contact with a lower surface of the cover member. In the step of disposing the crucible at a location apart from the area, the crucible suspended by the hook member is disposed above the area, and in the step of disposing the crucible in the area, the shaft is moved down to dispose the crucible in the area.

In this case, it is easy to move the crucible to a predetermined area in the chamber.

Preferably, in the step of evacuating the chamber, a getter for adsorbing nitrogen gas is housed in the chamber.

In this case, the impurity nitrogen gas is not likely to remain in the chamber.

A manufacturing apparatus of a SiC single crystal according to an embodiment of the present invention houses a crucible. The manufacturing apparatus includes a chamber, a discharging unit for evacuating the chamber, a shaft, and a hook member. The shaft is up-and-down movable in the chamber and a SiC seed crystal can be attached to a lower end of the shaft. The hook member is disposed at a shaft portion apart from the lower end of the shaft to suspend the crucible.

In this case, the crucible can be moved up and down by the shaft.

Preferably, the crucible includes a cover member having a hole into which the shaft is inserted. The hook member is disposed in the crucible, and suspends the crucible by being brought into contact with a lower surface of the cover member.

In this case, the crucible can be easily suspended.

Hereinafter, the method for manufacturing an n-type SiC single crystal according to the present embodiment described above will be described in detail.

[Configuration of Manufacturing Apparatus]

Figure 1:
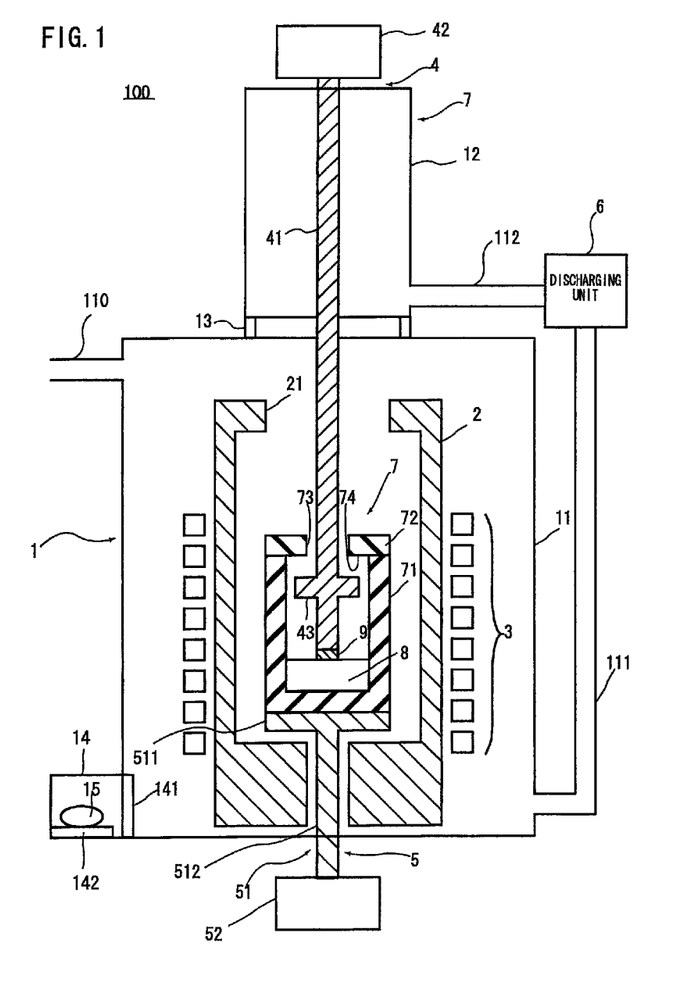
FIG. 1 is a schematic diagram showing a manufacturing apparatus of a SiC single crystal according to an embodiment of the present invention.

The method for manufacturing an n-type SiC single crystal according to the present embodiment utilizes a TSSG method. FIG. 1 is a schematic diagram of a manufacturing apparatus of a SiC single crystal according to the present embodiment.

Referring to FIG. 1, a manufacturing apparatus 100 includes a chamber 1, an insulating member 2, a heating unit 3, an up-and-down moving unit 4, a rotary unit 5, and a discharging unit 6.

The chamber 1 houses the insulating member 2 and the heating unit 3. When an n-type SiC single crystal is manufactured, the chamber 1 is water cooled. The chamber 1 includes a main room 11 and a sub-room 12. In FIG. 1, the sub-room 12 is disposed above the main room 11, and is partitioned by a gate valve 13. In FIG. 1, the gate valve 13 is opened. The main room 11 has an area in which a crucible 7 is disposed.

The rotary unit 5 includes a rotating member 51 and a drive source 52. The rotating member 51 includes a rotating table 511 and a shaft 512. The drive source 52 is disposed below the chamber 1. The lower end portion of the shaft 512 is disposed below the chamber 1, and the upper end of the shaft 512 is disposed in the chamber 1. The lower end portion of the shaft 512 is connected to the drive source 52. The rotating table 511 is attached to the upper end of the shaft 512. The crucible 7 is disposed in an area on the rotating table 511. To be specific, the crucible 7 is disposed on the upper surface of the rotating table 511. In the area on the rotating table 511 where the crucible 7 is disposed (hereinafter, is also referred to as a "disposing area"), a plurality of pyrometers (high-temperature thermometers) are disposed.

Upon manufacturing an n-type SiC single crystal, the rotary unit 5 rotates the crucible 7. To be specific, the drive source 52 rotates the shaft 512. Thereby, the crucible 7 disposed on the rotating table 511 rotates.

The crucible 7 includes a housing-shaped main body 71 and a cover member 72. The crucible 7 houses a SiC solution 8. The SiC solution 8 is a starting material of the n-type SiC single crystal and contains silicon (Si) and carbon (C). The SiC solution 8 may further contain one or more kinds of metal elements other than Si and C. The SiC solution 8 is produced by heating and melting a starting material of SiC solution.

The main body 71 is a housing having an opening at its upper end. The main body 71 is made of graphite. The cover member 72 is plate-shaped. The cover member 72 has a lower surface 74. The cover member 72 further has a through hole 73 in its center.

The up-and-down moving unit 4 includes a seed shaft 41 and a drive source 42. The drive source 42 is disposed above the chamber 1. The seed shaft 41 is bar-shaped. The lower end portion of the seed shaft 41 is disposed in the chamber 1. The upper end portion of the seed shaft 41 is disposed above the chamber 1. The upper end portion of the seed shaft 41 is connected to the drive source 42. The drive source 42 moves up and down the seed shaft 41. The drive source 42 further rotates the seed shaft 41 around the axis of the seed shaft 41. The lower end of the seed shaft 41 is disposed in the crucible 7 through the through hole 73. A SiC seed crystal 9 is attached to the lower end of the seed shaft 41. The SiC seed crystal 9 is plate-shaped and made up of a SiC single crystal.

Upon manufacturing a SiC single crystal, the seed shaft 41 is moved down so that the SiC seed crystal 9 is immersed into the SiC solution 8. At this moment, the disposing area is held at a crystal growth temperature. The temperature of the disposing area is, for example, the surface temperature of the rotating table 511 and is measured by the above described pyrometer. The crystal growth temperature depends on the composition of the SiC solution. A typical crystal growth temperature is 1600° C. to 2000° C.

The seed shaft 41 further includes a hook member 43. The hook member 43 is attached to a portion of the seed shaft, which is above the lower end of the seed shaft 41. In the present example, the hook member 43 is ring-shaped and is internally inserted with the seed shaft 41. The hook member 43 is secured to the seed shaft 41.

The hook member 43 is housed in the crucible 7. The hook member 43 has an outer diameter larger than the diameter of the through hole 73. As a result of the hook member 43 coming into contact with the lower surface 74 of the cover member 72, the hook member 43 suspends the crucible 7. In this occasion, the crucible 7 moves up along with the seed shaft 41.

Upon manufacturing a SiC single crystal, the rotary unit 5 rotates the crucible 7. Further, the up-and-down moving unit 4 rotates the seed shaft 41. In short, the crucible 7 and the SiC seed crystal 9 rotate, respectively. The seed shaft 41 and the shaft 512 are coaxially disposed. Further, the up-and-down moving unit 4 gradually pulls up the seed shaft 41 while rotating it. At this moment, a SiC single crystal is grown on the surface of the SiC seed crystal.

The heating unit 3 is disposed around the crucible 7. In the present example, the heating unit 3 is a ring-shaped high-frequency coil, and is disposed coaxially with the seed shaft 41 and the shaft 512. The heating unit 3 inductively heats the disposing area and the crucible 7 and melts the starting material housed in the crucible 7, thereby producing the SiC solution 8.

The insulating member 2 is housing-shaped and has a side wall, an upper cover, and a lower cover. The side wall of the insulating member 2 is disposed between the heating unit 3 and the crucible 7. Further, the side wall of the insulating member 2 is disposed around the crucible 7. The upper cover of the insulating member 2 is disposed above the cover member 72. The upper cover is formed with a through hole 21 for passing the crucible 7 therethrough. The lower cover of the insulating member 2 is disposed below the rotating table 511. The lower cover has a through hole for passing the shaft 512 therethrough. In short, the insulating member 2 covers the entire crucible 7.

The insulating member 2 includes a well-known insulating material. The insulating material is a fibrous or non-fibrous molded insulating material. In order to form a SiC single crystal having a diameter of not less than 2 inches, a high heating efficiency needs to be maintained. The insulating member 2 can maintain a high heating efficiency.

The chamber 1 further includes a gas inlet pipe 110 and gas outlet pipes 111 and 112. The gas inlet pipe 110 connects to the main room 11. The gas outlet pipe 111 connects the main room 11 with the discharging unit 6. The gas outlet pipe 112 connects the sub-room 12 with the discharging unit 6. Each of the pipes 110 to 112 includes a valve not shown.

The discharging unit 6 is for example a vacuum pump. The discharging unit 6 exhausts the gas of the chamber 1 to the outside via the gas outlet pipes 111 and 112, to substantially evacuate the chamber 1. The chamber 1 is provided with a pressure gauge not shown. While the discharging unit 6 is operating, the valve of the gas inlet pipe 110 is closed.

A mixed gas composed of desired components is introduced into the gas inlet pipe 110. The mixed gas contains a predetermined amount of nitrogen gas, with the balance being composed of a noble gas. The noble gas is, for example, helium, neon, argon, krypton, xenon, and radon. The nitrogen gas works as a dopant for an n-type SiC single crystal. According to a desired nitrogen concentration of the n-type SiC single crystal, the nitrogen gas content in the noble gas is determined.

The chamber 1 further includes a housing room 14. The housing room 14 is disposed next to the main room 11. The housing room 14 and the main room 11 are partitioned by an open-and-close door 141. When the open-and-close door 141 is closed, the housing room 14 is hermetically closed. A conveyor unit 142 is further disposed in the housing room 14. A getter 15 is disposed on the conveyor unit 142. The conveyor unit 142 can move from the housing room 14 to the main room 11 by means of a drive source not shown.

The getter 15 absorbs nitrogen gas. The getter 15 contains one or more kinds selected from the group consisting of titanium (Ti), zirconium (Zr), vanadium (V), and chromium (Cr). All of these elements have a high affinity with nitrogen.

[Manufacturing Method of n-Type SiC Single Crystal]

A method for manufacturing an n-type SiC single crystal according to the present embodiment utilizes the above described manufacturing apparatus 100. The method for manufacturing an n-type SiC single crystal according to the present embodiment includes an impurity discharging step, a crucible disposing step, a mixed gas filling step, a SiC solution producing step, and a single crystal growing step. Hereinafter, each step will be described in detail.

[Impurity Discharging Step]

In the impurity discharging step, impurity nitrogen gas in the chamber 1 is discharged to the outside.

To be specific, the crucible 7 is not disposed on the disposing area on the rotating table 511, and the chamber 1 is hermetically closed. Then, the interior of the chamber 1 is heated by the heating unit 3. At this moment, the temperature of the disposing area rises. Further, the chamber 1 is evacuated by the discharging unit 6 while the disposing area remains to be heated.

As a result of heating the disposing area, nitrogen adsorbed to the insulating member 2, the rotating member 51, the seed shaft 41, etc. is desorbed so that impurity nitrogen gas is released. At this moment, other impurities other than nitrogen are also desorbed, and impurity gas is released. The impurity nitrogen gas and the impurity gas are discharged to the outside by the discharging unit 6.

A preferable temperature of the disposing area (also referred to as a heating temperature) is not less than 1100° C. To be more specific, a preferable temperature at the surface of the rotating table 511 is not less than 1100° C. When the heating temperature is not less than 1100° C., a majority of nitrogen adhering to each member (the insulating member 2, the rotating member 51, and the seed shaft 41, etc.) of the chamber 1 desorbs. Further, a preferable degree of vacuum of the chamber 1 when the temperature of the disposing area becomes the above described heating temperature is not more than $1.0 \times 10^{-1}$ Pa. In this case, a majority of desorbed impurity nitrogen gas can be discharged. Therefore, adjusting the degree of vacuum of the chamber 1 to be not more than $1.0 \times 10^{-1}$ Pa at the heating temperature of not less than 1100° C. will lead to a marked decrease in the variation in nitrogen concentration of n-type SiC single crystals manufactured. A preferable degree of vacuum is not more than $5.0 \times 10^{-2}$ Pa. However, there is no need of making it not more than $1.0 \times 10^{-2}$ Pa. This is because if the variation in nitrogen concentration can be reduced, there is no need of excessively decreasing the degree of vacuum. Further, an excessive decrease of the degree of vacuum will decrease the production efficiency and raise the facility cost.

More preferably, the disposing area is heated to not less than the crystal growth temperature. The term "crystal growth temperature" used herein means the temperature of the SiC solution in the vicinity of a SiC seed crystal in the single crystal growing step described below. In this case, in the step of growing an n-type SiC single crystal, almost no impurity nitrogen gas is generated. This is because, the impurity nitrogen gas which is to be generated as a result of the disposing area being held at the crystal growth temperature has already been generated in the impurity discharging step and has been discharged to the outside by the discharging unit 6. Therefore, the variation in nitrogen concentration of SiC single crystals manufactured will markedly decrease. The degree of vacuum at this time is preferably not more than $1.0 \times 10^{-1}$ Pa, and more preferably not more than $5.0 \times 10^{-2}$ Pa. An upper limit of the preferable heating temperature is the crystal growth temperature+100° C.

Although a preferable holding time at a heating temperature varies depending on the amount of impurity gas adsorbed to members, it is typically about 1 to 2 hours.

In the impurity discharging step, a getter may be utilized. In this case, the getter 15 is conveyed into the main room 11 before the impurity discharging step is carried out. To be specific, the open-and-close door 141 is opened. Then, the conveyor unit 142 is made to slide so as to move from the housing room 14 to the main room 11. As a result of the above described steps, the getter 15 is disposed in the main room 11. While the impurity discharging step is carried out, the getter 15 absorbs impurity nitrogen gas. On that account, the impurity nitrogen gas is not likely to remain in the chamber 1. After the impurity discharging step is ended, the getter 15 is housed in the housing room 14. After the getter 15 is housed, the open-and-close door 141 is closed so that the housing room 14 is hermetically closed.

[Crucible Disposing Step]

After the impurity discharging step is carried out, the crucible 7 is disposed on the rotating table 511 (the crucible disposing step). The crucible disposing step is performed by, for example, the following method.

Figure 2:
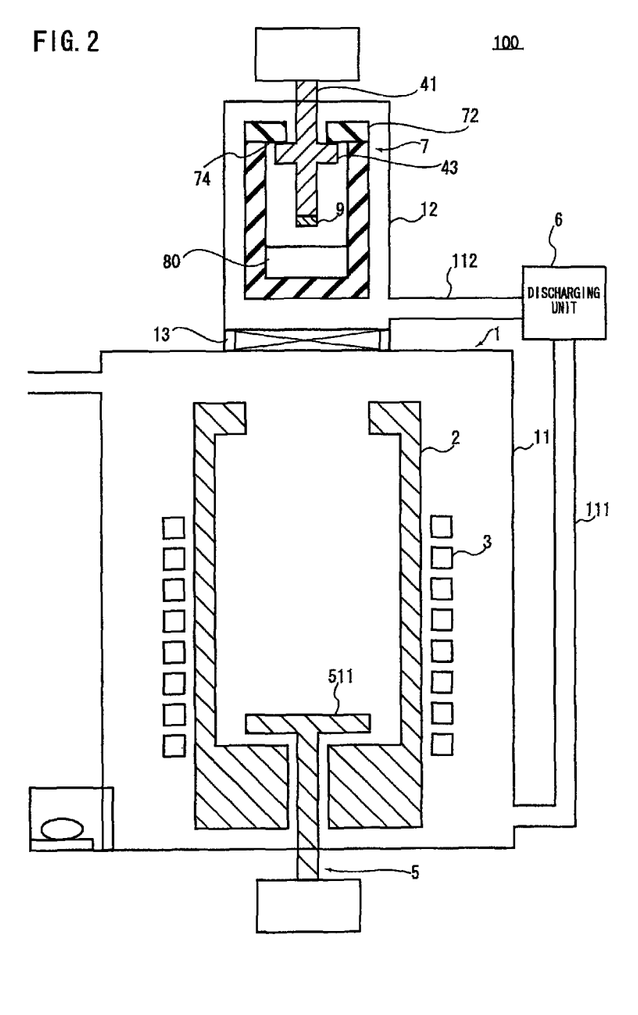
FIG. 2 is a diagram to explain the location where a crucible is housed in an early stage of the manufacturing process.

Before carrying out the impurity discharging step, the crucible 7 is housed in the sub-room 12 as shown in FIG. 2. In FIG. 2, the hook member 43 is in contact with the lower surface 74 of the cover member 72, and the crucible 7 is suspended by the hook member 43. On that account, the crucible 7 is housed in the sub-room 12 as being attached to the seed shaft 41. At this moment, the gate valve 13 is closed. Note that a SiC seed crystal 9 is attached to the lower end of the seed shaft 41.

The crucible 7 houses a starting material 80 of a SiC solution 8. The starting material 80 may be a Si single element or may contain Si and another metal element. Examples of the metal element contained in the starting material 80 include titanium (Ti), manganese (Mn), chromium (Cr), cobalt (Co), vanadium (V), and iron (Fe). Preferable elements contained in the starting material 80 are Ti and Mn, and more preferable element is Ti. When the starting material 80 is made up of Si and Ti, supposing that the molar ratio between Si and Ti is expressed as Si:Ti=1−X:X, preferable X is $0.15 \leq X \leq 0.25$. Moreover, when the starting material 80 is made up of Si and Mn, supposing that the molar ratio between Si and Mn is expressed as Si:Mn=1−X:X, preferable X is $0.35 \leq X \leq 0.65$.

When the impurity discharging step is carried out, the sub-room 12 is also evacuated by the discharging unit 6. Preferably, the degree of vacuum of the sub-room 12 is also kept at not more than $1.0 \times 10^{-1}$ Pa. That is, the degree of vacuum of the sub-room 12 is kept at not more than that of the main room 11.

After the impurity discharging step ends, valves not shown of the gas outlet pipes 111 and 112 are closed. Then, the gate valve 13 is opened and the seed shaft 41 is moved down. At this moment, the crucible 7 is moved down.

Figure 3:
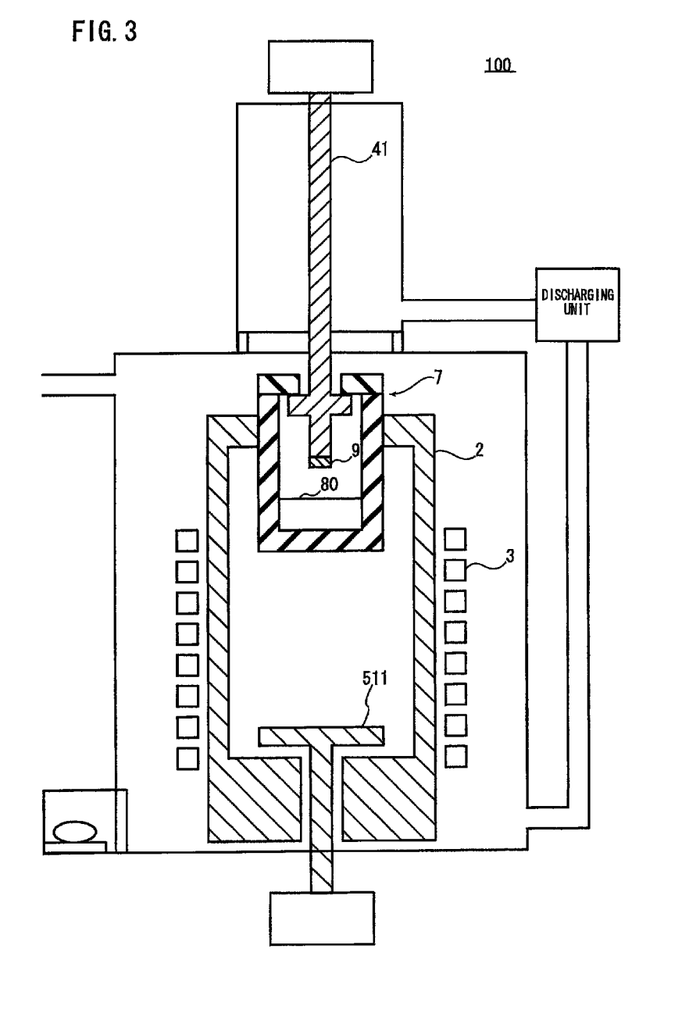
FIG. 3 is a diagram to explain the movement of the crucible during the manufacturing process.

When the seed shaft 41 is kept on moving down, the crucible 7 is inserted within the insulating member 2 as shown in FIG. 3. Then, when the seed shaft 41 further moves down, the crucible 7 is disposed on the rotation table 511. Suppose that after the crucible 7 is disposed on the rotating table 511, the seed shaft 41 further moves down. In this case, the hook member 43 leaves from the lower surface of the cover member 72. Therefore, the crucible 7 will not move and only the seed shaft 41 will move down. By the method described so far, the crucible 7 is disposed on the rotating table 511.

Note that the method for disposing the crucible 7 on the rotating table 511 will not be limited to the above described method. For example, a conveyor unit different from the seed shaft 41 may be attached to the inside of the chamber 1, and the crucible 7 may be disposed on the rotating table 511 by using the conveyor unit. The conveyor unit is, for example, a robot arm which is capable of grasping the crucible 7.

[Mixed Gas Filling Step]

After the crucible disposing step is carried out, the chamber 1 is filled with a mixed gas. The mixed gas contains nitrogen gas, with the balance being composed of one or more kinds of noble gases.

The concentration of nitrogen gas contained in the mixed gas is determined based on the amount of nitrogen to be contained in the n-type SiC single crystal. As described above, a preferable nitrogen concentration of the n-type SiC single crystal is $8.0 \times 10^{18}$ to $3.0 \times 10^{19}$ cm$^{-3}$. In this case, the preferable nitrogen concentration in the mixed gas is 0.02% to 0.10% by volume ratio.

A valve not shown of the gas inlet pipe 110 is opened so that the mixed gas is introduced into the chamber 1 to fill the same. At this moment, a preferable pressure in the chamber 1 is the atmospheric pressure. This is because keeping the interior of the chamber 1 at the atmospheric pressure will allow the process steps thereafter to be easily operated. However, the pressure in the chamber 1 may be not less than or not more than the atmospheric pressure.

[SiC Solution Producing Step and Single Crystal Growing Step]

After the mixed gas is filled into the chamber 1, an n-type SiC single crystal is produced (the SiC solution producing step and the single crystal growing step).

First, a SiC solution 8 is produced (the SiC solution producing step). The starting material 80 in the crucible 7 is heated to not less than its melting point by the heating unit 3. When the starting material 80 in the crucible 7 is heated, carbon dissolves into the melt from the crucible 7 so that the SiC solution 8 is produced. Therefore, the SiC solution 8 contains Si and C. The SiC solution 8 may further contain another metal element. When carbon of the crucible 7 dissolves into the SiC solution 8, the carbon concentration in the SiC solution 8 approaches to its saturation concentration.

After the SiC solution 8 is produced, an n-type SiC single crystal is grown (the single crystal growing step). To be specific, the seed shaft 41 is further moved down. At this moment, the hook member 43 leaves from the lower surface of the cover member 72. On that account, the crucible 7 will not move and only the seed shaft 41 moves down. Then, the SiC seed crystal 9 is immersed into the SiC solution 8.

After the SiC seed crystal 9 is immersed into the SiC solution 8, at least the disposing area is held at a crystal growth temperature by the heating unit 3. Further, at least a portion of the SiC solution 8 proximal to the SiC seed crystal 9 is super cooled such that SiC in the SiC solution 8 is supersaturated. Hereinafter, a portion of the SiC solution 8 proximal to the SiC seed crystal 9 is simply referred to as a "proximal portion". The method for cooling at least the proximal portion in the SiC solution 8 is as follows.

For example, the heating unit 3 is controlled such that the temperature of the proximal portion is lower than that of other portions of the SiC solution 8. Also, the proximal portion may be cooled by a coolant. To be specific, the coolant is circulated inside the seed shaft 41. The coolant is for example water. Circulating the coolant inside the seed shaft 41 will cause the SiC seed crystal 9 to be cooled. Since the proximal portion is located around the SiC seed crystal 9, when the SiC seed crystal 9 cools, the proximal portion will also cool. When the proximal portion is brought into a supercooled state by the above described method, the SiC concentration in the proximal portion of the SiC solution 8 increases and is supersaturated.

While SiC in the proximal portion of the SiC solution 8 is kept in a supersaturated state, the SiC seed crystal 9 and the SiC solution 8 are rotated. Rotating the seed shaft 41 causes the SiC seed crystal 9 to rotate. Rotating the rotating member 51 causes the crucible 7 to rotate. The rotating direction of the SiC seed crystal 9 may be opposite to or the same as that of the crucible 7. Moreover, the rotating speed may be constant or may vary. The seed shaft 41 gradually moves up while rotating. At this moment, a SiC single crystal is grown on the surface of the SiC seed crystal 9 which is immersed in the SiC solution 8 supersaturated with SiC. When a SiC single crystal is grown, the nitrogen in the mixed gas in the chamber 1 is taken into the SiC single crystal. Therefore, an n-type SiC single crystal is grown on the surface of the SiC seed crystal 9. Rotating the seed shaft 41 and the crucible 7 accelerates crystal growth and facilitates uniform crystal growth.

Preferably, the SiC seed crystal 9 is a SiC single crystal having a 4H-type crystal structure. In this case, the n-type SiC single crystal to be grown also has a 4H-type crystal structure. Preferably, the surface of the SiC seed crystal 9 (corresponding to the lower surface of the SiC seed crystal in FIG. 1) is the (0001) plane or a plane tilted from the (0001) plane by an angle of not more than 8°.

As so far described, in the method for manufacturing an n-type SiC single crystal according to the present embodiment, nitrogen adsorbed to various members in the chamber 1 is desorbed and the impurity nitrogen gas is discharged to the outside of the chamber 1 by the impurity discharging step. Thereafter, in the mixed gas filling step, a mixed gas having a desired nitrogen concentration is filled in the chamber 1. Thereafter, an n-type SiC single crystal is grown. On that account, it is possible to suppress the variation in nitrogen concentration of the n-type SiC single crystals caused by the impurity nitrogen gas in the chamber 1.

Further, in the impurity discharging step, when the heating temperature of the disposing area is not less than 1100° C. and the degree of vacuum is not more than $1.0 \times 10^{-1}$ Pa, the variation in nitrogen concentration of the n-type SiC single crystals will markedly decrease. Further, when the heating temperature of the disposing area is not less than the crystal growth temperature, the variation in nitrogen concentration of the n-type SiC single crystals will further markedly decline.

Therefore, in the present embodiment, it is possible to control the nitrogen concentration in an n-type SiC single crystal by adjusting the nitrogen concentration in the mixed gas.

In the above described embodiment, in the impurity discharging step, the crucible 7 is disposed in the sub-room 12 located apart from the rotating table 511. However, the heating in the impurity discharging step may be carried out with the crucible 7 being disposed on the rotating table 511. In this case, the heating temperature is preferably less than the melting point of the starting material of the SiC solution in the crucible 7. This is because, if the heating temperature becomes not less than the melting point of the starting material, a SiC solution may be produced in the crucible 7 in the impurity discharging step. A preferable heating temperature in this case is not less than 1100° C. and less than 1400° C.

In the above described embodiment, the chamber 1 includes a main room 11 and a sub-room 12, and the main room 11 and the sub-room 12 are partitioned by a gate valve 13. However, the chamber 1 may include only the main room 11 without including the sub-room 12 and the gate valve 13. In this case, in the impurity discharging step, the crucible 7 is disposed in an upper part of the chamber 1 as being suspended by the hook member 43. That is, the crucible 7 is disposed upwardly apart from the area (on the rotating table 511) in which the crucible 7 is disposed. Disposing the crucible 7 above the rotating table 511 will result in that even if the temperature on the rotating table 511 becomes not less than 1100° C. in the impurity discharging step, the temperature of the starting material in the crucible 7 will be less than the temperature on the rotating table 511. Therefore, the SiC solution 8 is not likely to be produced.

In the above described embodiment, a crucible 7 made of graphite is used. However, the crucible 7 is not limited to one made of graphite. For example, a coating made up of SiC may be formed on the inner surface of the crucible 7. In this case, SiC in the coating will dissolve into the melt and a SiC solution 8 is produced.

Moreover, the crucible 7 may not contain carbon, and the starting material may contain carbon (graphite etc.). Further, when the crucible 7 does not contain carbon, the SiC solution 8 may be produced by the following method. A hydrocarbon gas is flown into the chamber 1 which houses the crucible 7 including the starting material 80. The hydrocarbon gas is, for example, methane and propane. In the chamber 1 into which the hydrocarbon gas has been flown, the solution in the crucible 7 is heated by the heating unit 3. At this moment, carbon is generated through the pyrolysis of the gas, and carbon dissolves into the solution. As a result, a SiC solution 8 is produced.

In the above described embodiment, a mixed gas containing a noble gas and nitrogen gas is flown into the chamber 1 from the outside. However, a noble gas and nitrogen gas may be separately flown into the chamber 1 to produce a mixed gas in the chamber 1.

EXAMPLES

By utilizing a manufacturing apparatus having the same configuration as in FIG. 1, a plurality of n-type SiC single crystals were manufactured by the TSSG method.

[Test No. 1]

In the test of Test No. 1, SiC single crystals were manufactured by the following method.

[Before Single Crystal Growth]

A starting material obtained by mixing a high-purity Si starting material having a purity of 99.9999% by mass and a high-purity Ti starting material having a purity of 99.995% by mass at Si:Ti=80:20 (by molar ratio) was housed in a graphite crucible. The crucible was housed in a sub-room. Next, the impurity exhausting step was carried out. To be specific, a high frequency induction heating was performed by the heating unit in the manufacturing apparatus to heat the interior of the chamber. Further, the chamber was evacuated while heating the interior of the chamber. When an impurity gas (including impurity nitrogen gas) is generated in the chamber due to heating, the degree of vacuum in the chamber will deteriorate. Accordingly, when the degree of vacuum became not less than $5 \times 10^{-1}$ Pa, the heating was stopped until the degree of vacuum became not more than $5 \times 10^{-1}$ Pa. By repeating the heating, the temperature of the disposing area (the area on the rotating table 511) in the chamber reached at 1100° C., and the degree of vacuum reached at $9.0\times10^{-2}$ Pa. Thereafter, the heating was stopped to cause the temperature of the interior of the chamber 1 to be lowered to the room temperature (25° C.). At this moment, the degree of vacuum in the chamber 1 was $1\times10^{-3}$ Pa.

[Undoped Material Growing Step]

Next, the crucible disposing step was carried out to dispose the crucible on the rotating table. Then, a gas containing no nitrogen was flown into the chamber 1 in an atmospheric gas adjustment step, and a SiC single crystal growing step (an undoped material growing step) was carried out. To be specific, helium having a purity of 6N (99.9999% by mass) was flown into the chamber and kept the pressure of the chamber at the atmospheric pressure. Next, the crucible of the chamber was heated to and held at 1850° C. for an hour by the heating unit 3.

Next, the seed shaft having a SiC seed crystal attached to its lower end was moved down to immerse the SiC seed crystal into the SiC solution in the crucible. The SiC seed crystal had a disc shape having a diameter of 2 inches. The SiC seed crystal was a SiC single crystal having a 4H-type crystal structure, and was an on-axis crystal. The SiC seed crystal was immersed in the SiC solution in the crucible for 5 hours to grow a SiC single crystal. The crystal growth temperature at this time was 1850° C. Moreover, the heating unit was controlled such that the temperature of a portion of the solution around a location where the SiC seed crystal was immersed was about 15° C. lower than that of the other portion of the solution. On that account, the portion of the solution in which the SiC seed crystal was immersed became supercooled. Moreover, the seed shaft and the crucible were steadily rotated in the directions opposite to each other. The rotational speed was 10 rpm for both the seed shaft and the crucible. After 5 hours had elapsed, the seed shaft was moved up by 20 mm, and the produced SiC single crystal was taken out from the SiC solution, interrupting the crystal growth.

[Doped Material Growing Step]

Next, a doped material growing step was carried out. A helium gas in the chamber was exhausted and in place of it, a mixed gas was flown into the chamber and the pressure in the chamber was adjusted to be the atmospheric pressure. The mixed gas was a helium gas containing 0.05% by volume of nitrogen, with the balance being composed of a helium gas having a purity of 6N.

After 30 minutes had passed since the mixed gas was flown into, the seed shaft was moved down to immerse the SiC single crystal in the SiC solution. Then, the production of the SiC single crystal was resumed. The manufacturing conditions of crystal growth (the crystal growth temperature, the temperature of the solution around the SiC seed crystal, and the rotational speed of the seed shaft and the crucible) at that time were the same as those in the undoped material growing step. After 5 hours had passed since the resumption of the production of a SiC single crystal, the SiC single crystal was taken out from the SiC solution, thereby ending crystal growth. By the above described steps, SiC single crystal which were not subjected to nitrogen doping, and SiC single crystal which were subjected to nitrogen doping were obtained.

Figure 4:
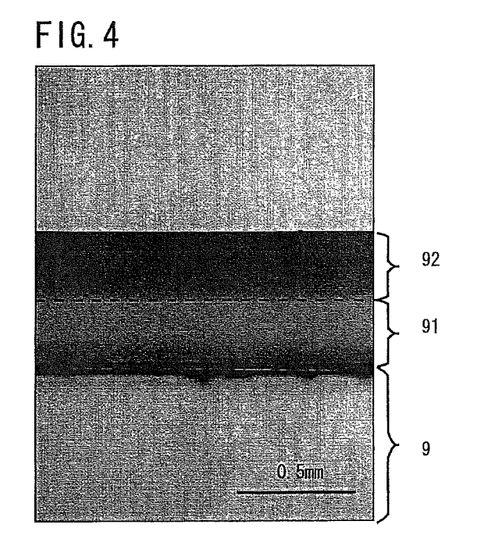
FIG. 4 is a cross section photograph of a SiC single crystal manufactured in an example of the present invention.
Figure 5:
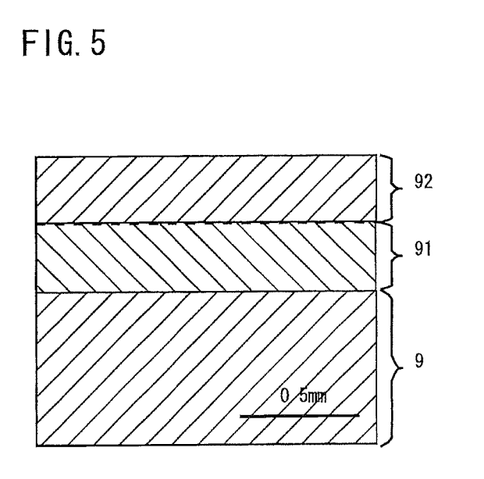
FIG. 5 is a schematic diagram of the SiC single crystal shown by FIG. 4.

Cross section photographs of the SiC single crystals obtained by the above described method are shown in FIG. 4, and a schematic diagram thereof is shown in FIG. 5. Referring to FIGS. 4 and 5, a SiC single crystal 91 which was not subjected to nitrogen doping was grown on the SiC seed crystal 9. Further, on the SiC single crystal 91, a SiC single crystal 92 which was subjected to nitrogen doping was produced. Thereafter, the SiC single crystal 91 which was not subjected to nitrogen doping is referred to as an "undoped material", and the SiC single crystal 92 which was subjected to nitrogen doping is referred to as a "doped material". Five for each of the undoped materials and doped materials were produced by the above described method.

The reason why the undoped material and the doped material were produced is as follows. The nitrogen content of the undoped material corresponds to the nitrogen content (the amount of impurity nitrogen gas) which is inevitably taken into the SiC single crystal. On the other hand, the amount of nitrogen taken into the doped material corresponds to the nitrogen content which is intentionally doped. Therefore, it is possible to quantitatively compare the nitrogen content corresponding to the amount of impurity nitrogen gas with the nitrogen content which is intentionally doped.

[Test No. 2]

In Test No. 2, the starting material, and the degree of vacuum in the impurity discharging step were different compared to Test No. 1. In Test No. 2, a starting material made up of Si having a purity of 99.9999% by mass and Cr having a purity of 99.9% by mass was used. The ratio of Si and Cr in the starting material was Si:Cr=50:50 by molar ratio. Moreover, the degree of vacuum in the impurity discharging step was $9.1\times10^{-2}$ Pa. Other conditions were the same as those in Test No. 1.

[Test No. 3]

In Test No. 3, the starting material was different compared to Test No. 1. In Test No. 3, a starting material made up of Si having a purity of 99.9999% by mass and Ti having a purity of 99.8% by mass was used. The ratio of Si and Ti in the starting material was Si:Ti=80:20 by molar ratio. Other conditions were the same as those in Test No. 1.

[Test No. 4]

In Test No. 4, the degree of vacuum in the impurity discharging step was different compared to Test No. 1. To be specific, the degree of vacuum was $4.0\times10^{-2}$ Pa. Other conditions were the same as those in Test No. 1.

[Test No. 5]

In Test No. 5, a getter containing Ti and Zr was disposed in the chamber. Further, the degree of vacuum in the impurity discharging step was $2.0\times10^{-2}$ Pa. Further, the mixed gas in the doped material growing step contained 0.06% by volume ratio of nitrogen, with the balance being composed of a helium gas. Other conditions were the same as those in Test No. 1.

[Test No. 6]

In Test No. 6, the getter which is the same as that in Test No. 5 was housed in the chamber. Further, the heating temperature in the impurity discharging step was 1900° C., and the degree of vacuum was $8.0\times10^{-2}$ Pa. The heating in the impurity discharging step was stopped and the chamber was cooled to the room temperature (25° C.). The ultimate degree of vacuum at the room temperature was $3.0\times10^{-4}$ Pa. Further, in the doped material growing step, a mixed gas containing 0.07% by volume of nitrogen gas, the balance being made up of a helium gas having a purity of 99.9999% by mass was utilized. Other conditions were the same as those in Test No. 1.

[Test No. 7]

In Test No. 7, the same starting material as in Test No. 2 was used. Moreover, the same getter as in Test No. 5 was used. The heating temperature in the chamber in the impurity discharging step was 1900° C., and the degree of vacuum was $8.8\times10^{-2}$ Pa. After the heating was stopped, cooling to the room temperature (25° C.) was performed.

The ultimate degree of vacuum in the chamber at the room temperature was $2.9 \times 10^{-4}$ Pa. For the mixed gas in the doped material growing step, the same one as in Test No. 6 was used. Other conditions were the same as those in Test No. 1.

[Test No. 8]

In Test No. 8, the degree of vacuum in the impurity discharging step was $2.0 \times 10^{-1}$ Pa. Other conditions were the same as those in Test No. 1.

[Test No. 9]

In Test No. 9, the heating temperature in the impurity discharging step was 1000° C. Moreover, the degree of vacuum was $9.5 \times 10^{-2}$ Pa. Other conditions were the same as those in Test No. 1.

[Test No. 10]

In Test No. 10, the same starting material as in Test No. 1 was used. In Test No. 10, the impurity discharging step was not carried out. To be specific, after the crucible containing the starting material was housed in the chamber, the chamber was evacuated at the room temperature. Then, a helium gas having a purity of 99.9999% by mass was flown into the chamber until the pressure in the chamber became the atmospheric pressure. After a helium gas was flown into, the undoped material growing step and the doped material growing step were carried out as in Test No. 1. The crystal growth temperature in the undoped material growing step and the doped material growing step was 1850° C. In the doped material growing step, a mixed gas containing 0.02% by volume of nitrogen gas, with the balance being made up of a helium gas having a purity of 99.9999% by mass was used.

[Evaluation Test]

As described in the test method of Test No. 1, five undoped materials and five doped materials were manufactured for each test number. The nitrogen concentration of each of the SiC single crystals manufactured (undoped materials and doped materials) was measured by a secondary ion-microprobe mass spectrometer (SIMS).

Based on the measured nitrogen concentrations, a variation value $V$ (%) of nitrogen concentration of the doped material of each test number was determined by the following Formula (1).

$$V = (\text{Standard deviation of five nitrogen concentrations/average value of five nitrogen concentrations}) \times 100(\%) \quad (1)$$

[Evaluation Results]

Evaluation results are shown in Table 1.

TABLE 1

| Test No. | Starting material | Discharge condition | | | Crystal growth temperature (° C.) | Used gas | | Nitrogen amount in crystal ($cm^{-3}$) | | V value (%) n = 5 | Determination |
|---|---|---|---|---|---|---|---|---|---|---|---|
| | | Impurity discharging step | Heating temperature (° C.) | Degree of vacuum (Pa) | | Undoped material producing step | Doped material producing step | Undoped material ($cm^{-3}$) | Doped material ($cm^{-3}$) | | |
| 1 | Si80—Ti20 | Carried out | 1100 | $9.0 \times 10^{-2}$ | 1850 | Helium gas | Helium gas + 0.05% by volume of nitrogen gas | $3.0 \times 10^{18}$ ~$4.7 \times 10^{18}$ | $1.0 \times 10^{19}$ ~$1.2 \times 10^{19}$ | 6.3 | Good |
| 2 | Si50—Cr50 | Carried out | 1100 | $9.1 \times 10^{-2}$ | 1850 | Helium gas | Helium gas + 0.05% by volume of nitrogen gas | $2.9 \times 10^{18}$ ~$5.8 \times 10^{18}$ | $9.9 \times 10^{18}$ ~$1.3 \times 10^{19}$ | 9.1 | Good |
| 3 | Si80—Ti20 | Carried out | 1100 | $9.0 \times 10^{-2}$ | 1850 | Helium gas | Helium gas + 0.05% by volume of nitrogen gas | $3.8 \times 10^{18}$ ~$6.8 \times 10^{18}$ | $1.1 \times 10^{19}$ ~$1.3 \times 10^{19}$ | 9.6 | Good |
| 4 | Si80—Ti20 | Carried out | 1100 | $4.0 \times 10^{-2}$ | 1850 | Helium gas | Helium gas + 0.05% by volume of nitrogen gas | $1.5 \times 10^{18}$ ~$2.9 \times 10^{18}$ | $8.5 \times 10^{18}$ ~$9.9 \times 10^{18}$ | 5.2 | Good |
| 5 | Si80—Ti20 | Carried out With getter | 1100 | $2.0 \times 10^{-2}$ | 1850 | Helium gas | Helium gas + 0.06% by volume of nitrogen gas | $1.2 \times 10^{18}$ ~$2.5 \times 10^{18}$ | $8.2 \times 10^{18}$ ~$9.5 \times 10^{18}$ | 4.9 | Good |
| 6 | Si80—Ti20 | Carried out With getter | 1100 1900 | $2.0 \times 10^{-2}$ $8.0 \times 10^{-2}$ | 1850 | Helium gas | Helium gas + 0.07% by volume of nitrogen gas | $8.0 \times 10^{17}$ ~$8.5 \times 10^{17}$ | $9.0 \times 10^{18}$ ~$9.8 \times 10^{18}$ | 0.2 | Excellent |
| 7 | Si50—Cr50 | Carried out With getter | 1100 1900 | $2.5 \times 10^{-2}$ $8.8 \times 10^{-2}$ | 1850 | Helium gas | Helium gas + 0.07% by volume of nitrogen gas | $9.1 \times 10^{17}$ ~$1.0 \times 10^{18}$ | $9.9 \times 10^{18}$ ~$1.0 \times 10^{19}$ | 0.4 | Excellent |

TABLE 1-continued

| Test No. | Starting material | Impurity discharging step | Discharge condition Heating temperature (° C.) | Discharge condition Degree of vacuum (Pa) | Crystal growth temperature (° C.) | Used gas Undoped material producing step | Used gas Doped material producing step | Nitrogen amount in crystal (cm$^{-3}$) Undoped material (cm$^{-3}$) | Nitrogen amount in crystal (cm$^{-3}$) Doped material (cm$^{-3}$) | V value (%) n = 5 | Determination |
|---|---|---|---|---|---|---|---|---|---|---|---|
| 8 | Si80—Ti20 | Carried out | 1100 | 2.0 × 10$^{-1}$ | 1850 | Helium gas | Helium gas + 0.02% by volume of nitrogen gas | 3.9 × 10$^{18}$ ~8.7 × 10$^{18}$ | 7.9 × 10$^{18}$ ~1.3 × 10$^{19}$ | 15.4 | Fair |
| 9 | Si80—Ti20 | Carried out | 1000 | 9.5 × 10$^{-2}$ | 1850 | Helium gas | Helium gas + 0.02% by volume of nitrogen gas | 4.5 × 10$^{18}$ ~8.8 × 10$^{18}$ | 8.5 × 10$^{18}$ ~1.3 × 10$^{19}$ | 14.4 | Fair |
| 10 | Si80—Ti20 | Omitted | — | — | 1850 | Helium gas | Helium gas + 0.02% by volume of nitrogen gas | 4.7 × 10$^{18}$ ~1.1 × 10$^{19}$ | 8.7 × 10$^{18}$ ~1.5 × 10$^{19}$ | 41.7 | Poor |

The "Starting material" column in Table 1 shows the starting material of the melt used in each test number. The expression "Si80-Ti20" indicates that Si and Ti were used for the starting material, and the molar ratio between Si and Ti was Si:Ti=80:20. In the "Impurity discharging step" column, "Carried out" indicates that the impurity discharging step was carried out, and "Omitted" indicates that the impurity discharging step was not carried out. Further, "With getter" indicates that a getter was used in the impurity discharging step.

The "Heating temperature" column in the "Discharge condition" column indicates the heating temperature (° C.) in the chamber 1 in the impurity discharging step. The "Degree of vacuum" column indicates the degree of vacuum (Pa) in the impurity discharging step. The "Crystal growth temperature" column indicates the heating temperature (° C.) in the undoped material producing step and the doped material producing step. Further, the "Used gas" column indicates the chemical composition of the atmospheric gas used in the undoped material producing step and the doped material producing step.

The "Nitrogen amount in crystal" column indicates the range of the nitrogen concentration (cm$^{-3}$) of five undoped materials and five doped materials which were obtained for each test number. Further, the "V value" column indicates variation values V (%) of nitrogen concentrations of doped materials obtained by Formula (I).

The "Determination" column indicates the result of determination on whether or not doping control was possible. "Fair" in the "Determination" column indicates that the V value was not more than 20%. "Good" indicates that the V value is not more than 10%. "Excellent" indicates that the V value is not more than 1%. "Poor" indicates that the V value exceeded 20%.

Figure 6:
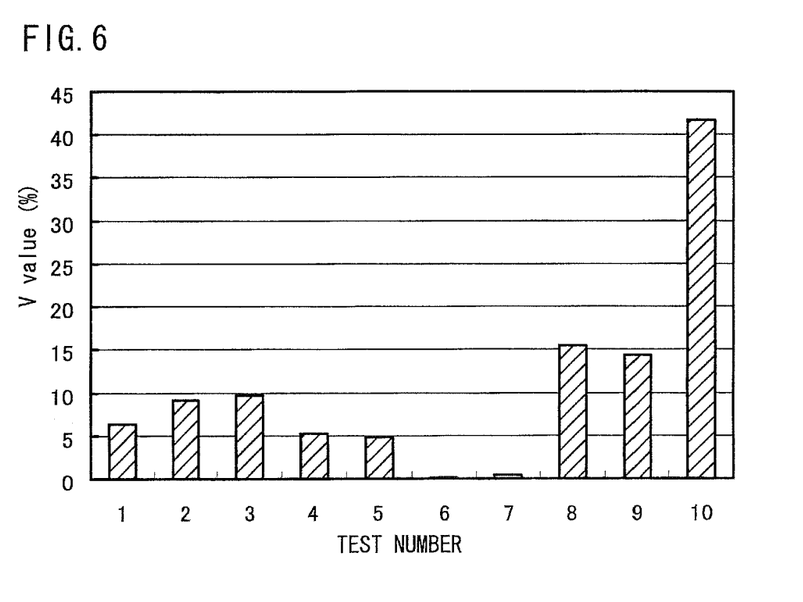
FIG. 6 is a bar graph showing the variation in nitrogen concentration of n-type SiC single crystals of each test number of the examples.

FIG. 6 is a bar graph of the V values of respective test numbers. In Test Nos. 1 to 9, the impurity discharging step was carried out. On that account, the V values were not more than 20%. Further, in Test Nos. 1 to 7, the heating temperature in the impurity discharging step was not less than 1100° C., and the degree of vacuum was not more than 1.0×10$^{-1}$ Pa. On that account, the V values were not more than 10%. Further, in Test Nos. 6 and 7, the heating temperature was 1900° C. which was not less than the heating temperature when producing the SiC solution (1850° C.). On that account, the V values were not more than 1%. On the other hand, in Test No. 10, the impurity discharging step was not carried out. On that account, the V value significantly exceeded 20%.

As shown in FIG. 6, the V values when the impurity discharging step was carried out (Test Nos. 1 to 9) were markedly smaller than the V value when the same step was not carried out (Test No. 10).

Figure 7:
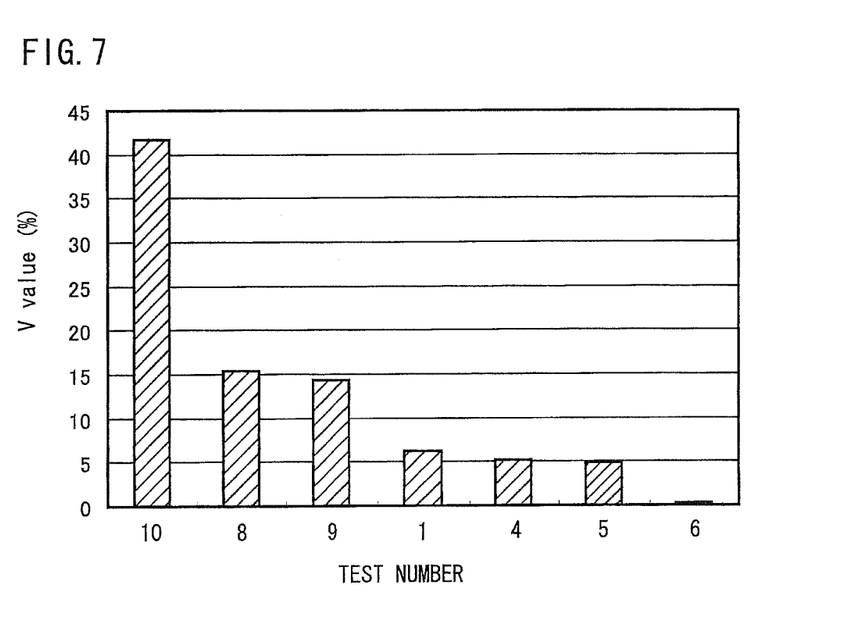
FIG. 7 is a bar graph showing the variation in nitrogen concentration of n-type SiC single crystals of specific test numbers different from those of FIG. 6.

FIG. 7 is a bar graph of V values of the test numbers in which the starting material in the crucible was the same (Test Nos. 1, 4 to 6, and 8 to 10). Referring to FIG. 7, when the starting material of the SiC solution was the same, the V value of Test No. 10 in which the impurity discharging step was not carried out was markedly larger than the V values of other test numbers (Test Nos. 1, 4 to 6, 8, and 9) in which the impurity discharging step was carried out. Moreover, in Test Nos. 8 and 9, the heating temperature in the impurity discharging step was less than 1100° C., or the degree of vacuum did not reach 1.0×10$^{-1}$ Pa. On the other hand, in Test Nos. 1, and 4 to 6, the heating temperature in the impurity discharging step was not less than 1100° C., and the degree of vacuum was not more than 1.0×10$^{-1}$ Pa. On that account, the V values of Test Nos. 1 and 4 to 6 were markedly smaller than the V values of Test Nos. 8 and 9. Moreover, in Test Nos. 1, 4 and 5, the heating temperature of the impurity discharging step was lower than the crystal growth temperature. On the other hand, in Test No. 6, the heating temperature in the impurity discharging step was higher than the crystal temperature. On that account, the V value of Test No. 6 was markedly smaller than the V values of Test Nos. 1, 4 and 5.

Comparing Test No. 1 with Test No. 4, although the degree of vacuum in the impurity discharging step did not reach 5.0×10$^{-2}$ Pa in Test No. 1, the degree of vacuum was not more than 5.0×10$^{-2}$ in Test No. 4. On that account, the V value of Test No. 4 was smaller than the V value of Test No. 1.

While some embodiments of the present invention have been described so far, the above described embodiments are merely exemplification for carrying out the present inven-

The invention claimed is:

1. A method for manufacturing an n-type SiC single crystal, comprising the steps of:
    providing a manufacturing apparatus including a chamber having an area in which a crucible is to be disposed;
    heating the area in which the crucible is to be disposed to not less than 1100° C. and evacuating the chamber to a degree of vacuum of not more than $1.0 \times 10^{-1}$ Pa;
    filling, after the evacuation, the chamber with a mixed gas containing a noble gas and nitrogen gas;
    heating and melting a starting material housed in the crucible disposed in the area to produce a SiC solution containing silicon and carbon; and
    immersing a SiC seed crystal into the SiC solution under the mixed gas atmosphere to grow an n-type SiC single crystal on the SiC seed crystal,
    wherein a concentration of the nitrogen gas contained in the mixed gas is 0.02% to 0.10% by volume ratio.

2. The manufacturing method according to claim 1, wherein
    in the evacuating step, the area is heated to not less than a crystal growth temperature of the n-type SiC single crystal.

3. The manufacturing method according to claim 1, wherein in the evacuating step, the chamber is evacuated to a degree of vacuum of not more than $5.0 \times 10^{-2}$ Pa.

4. The manufacturing method according to claim 1, wherein
    the manufacturing method further comprises the steps of:
    disposing the crucible at a location apart from the area in the chamber before evacuating the chamber; and
    disposing the crucible in the area after the evacuation.

5. The manufacturing method according to claim 4, wherein
    the crucible includes
        a cover member having a through hole,
    the manufacturing apparatus further including:
        a seed shaft being up-and-down movable in the chamber, wherein a SiC seed crystal is to be attached to a lower end of the shaft, and the lower end is disposed in the crucible through the through hole; and
        a hook member which is disposed at a shaft portion apart from the lower end of the seed shaft, and capable of suspending the crucible when coming into contact with a lower surface of the cover member, wherein
    in the step of disposing the crucible at a location apart from the area, the crucible suspended by the hook member is disposed above the area, and
    in the step of disposing the crucible in the area, the seed shaft is moved down to dispose the crucible in the area.

6. The manufacturing method according to claim 1, wherein
    in the step of evacuating the chamber, a getter for adsorbing nitrogen gas is housed in the chamber.

* * * * *